United States Patent
Maruyama et al.

(10) Patent No.: US 7,382,175 B2
(45) Date of Patent: Jun. 3, 2008

(54) FREQUENCY MIXER PREVENTING DEGRADATION IN LINEARITY ON AMPLITUDE OF INPUT SIGNAL

(75) Inventors: Takaya Maruyama, Itami (JP); Hisayasu Sato, Itami (JP)

(73) Assignee: Renesas Technology Corp., Chiyoda-Ku, Tokyo (JP)

( * ) Notice: Subject to any disclaimer, the term of this patent is extended or adjusted under 35 U.S.C. 154(b) by 503 days.

(21) Appl. No.: 11/083,242

(22) Filed: Mar. 18, 2005

(65) Prior Publication Data

US 2005/0208922 A1    Sep. 22, 2005

(30) Foreign Application Priority Data

Mar. 18, 2004    (JP) .............................. 2004-078650

(51) Int. Cl.
G06F 7/44    (2006.01)
H04B 1/26    (2006.01)

(52) U.S. Cl. ........................ 327/359; 327/358; 455/313

(58) Field of Classification Search ........ 327/350–361; 455/313, 318
See application file for complete search history.

(56) References Cited

U.S. PATENT DOCUMENTS 6,992,062 B2* 1/2006 Usala ........................... 514/12
7,054,609 B2* 5/2006 Wiklund et al. ............ 455/323

OTHER PUBLICATIONS

Ting-Ping Liu et al., "5-GHz CMOS Radio Transceiver Front-End Chipset", IEEE Journal of Solid-State Circuits, Dec. 2000, pp. 1927-1933, vol. 35, No. 1.
Wenjun Sheng et al., "A 3-V, 0.35-μm CMOS Bluetooth Receiver IC" IEEE Journal of Solid-State Circuits, Jan. 2003, pp. 30-42, vol. 38, No. 1.

* cited by examiner

Primary Examiner—Dinh T. Le
(74) Attorney, Agent, or Firm—Buchanan Ingersoll & Rooney PC

(57) ABSTRACT

A frequency mixer includes a first N channel MOS transistor, second and third N channel MOS transistors constituting a local oscillator signal differential pair, and having substantially identical properties, a first load, and a second load. The first N channel MOS transistor receives an RF signal at its gate. A local oscillator signal is applied to the gates of the second and third N channel MOS transistors. The drain current of the second and third N channel MOS transistors is output to the drain of the first N channel MOS transistor. An amplitude-current conversion circuit receives the RF signal and provides an output current to the drain of the first N channel MOS transistor to decrease monotonously the output current with respect to the amplitude of the RF signal.

5 Claims, 10 Drawing Sheets

RF INPUT SIGNAL HAVING SMALL AMPLITUDE

RF INPUT SIGNAL HAVING LARGE AMPLITUDE

RF INPUT SIGNAL HAVING SMALL AMPLITUDE

RF INPUT SIGNAL HAVING LARGE AMPLITUDE

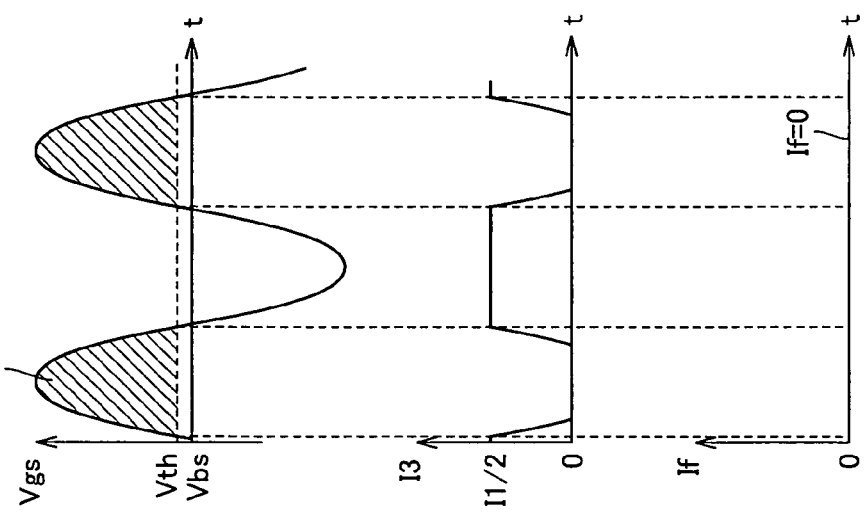
FIG.6A RF INPUT SIGNAL HAVING SMALL AMPLITUDE
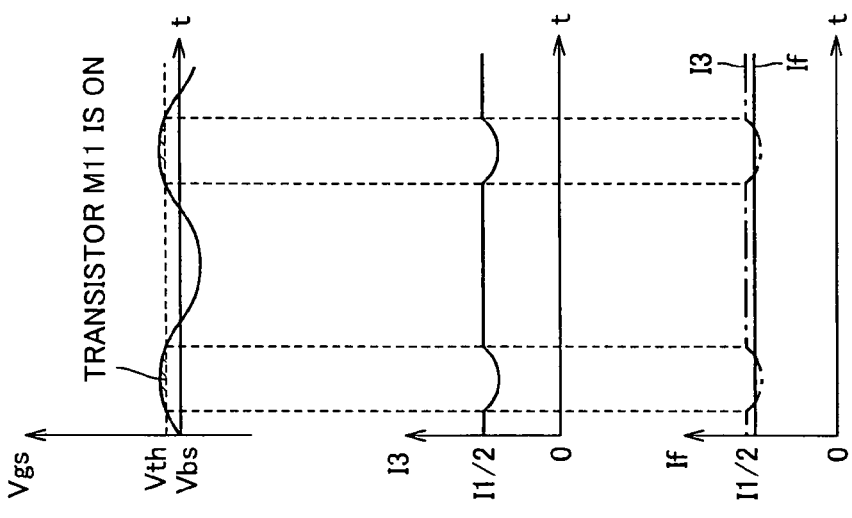
FIG.6B RF INPUT SIGNAL HAVING MODERATE AMPLITUDE
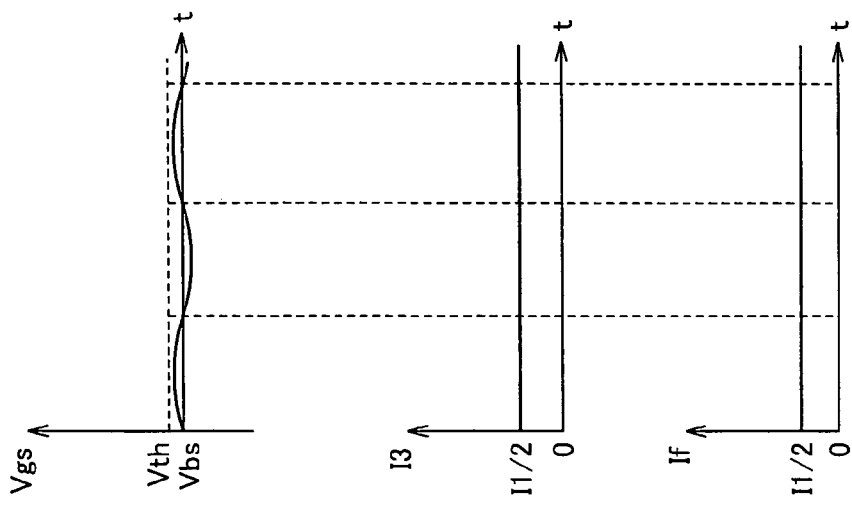
FIG.6C RF INPUT SIGNAL HAVING LARGE AMPLITUDE

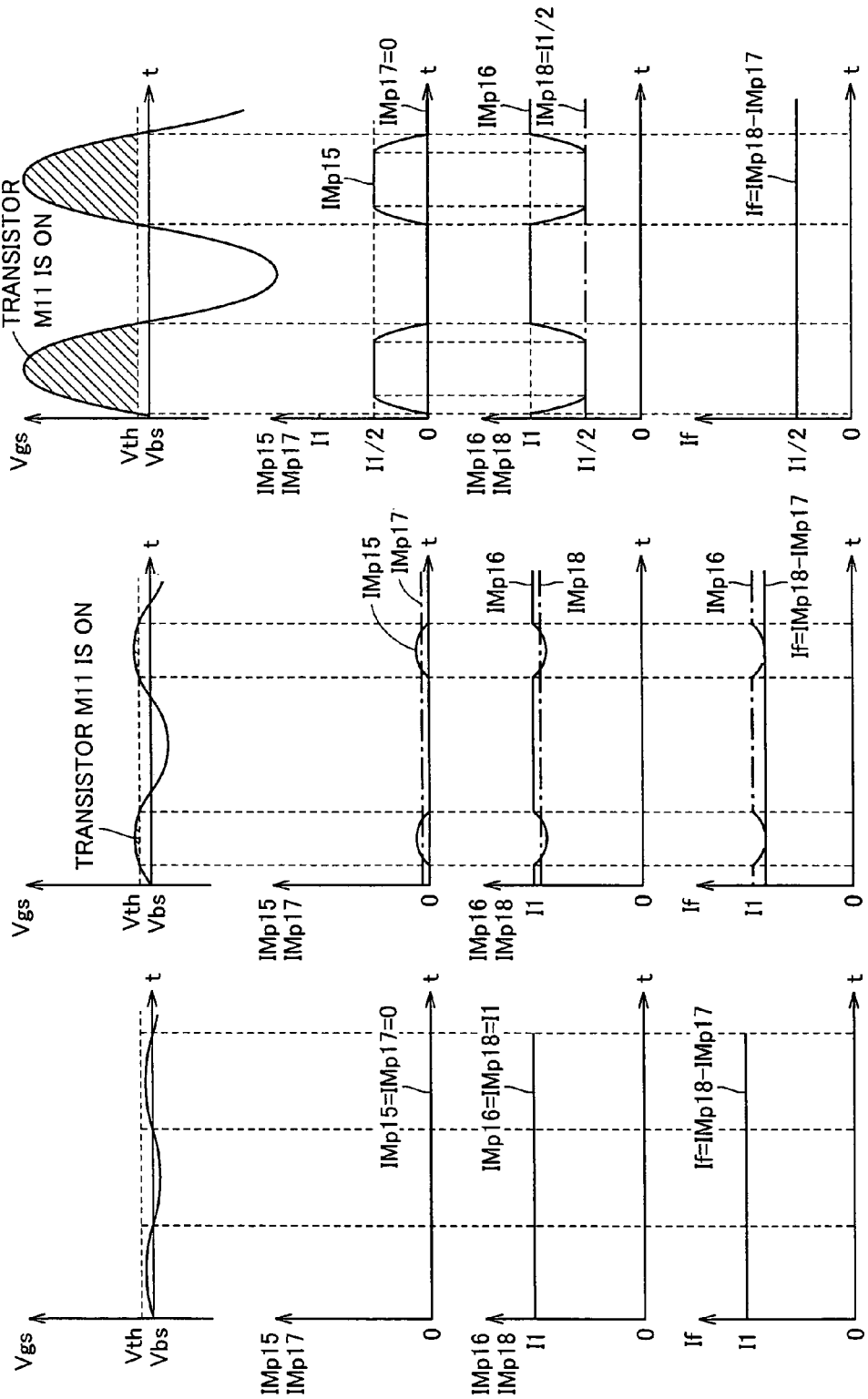

FREQUENCY MIXER PREVENTING DEGRADATION IN LINEARITY ON AMPLITUDE OF INPUT SIGNAL

BACKGROUND OF THE INVENTION

1. Field of the Invention

The present invention relates to frequency mixers, and more particularly, to a frequency mixer directed to improving linearity.

2. Description of the Background Art

For frequency conversion in a radio communication transceiver, a frequency mixer is employed for converting, for example, an RF signal (radio frequency signal) into an IF signal (intermediate frequency signal).

This frequency mixer functions to multiply two signals of different frequencies to generate a signal based on the multiplied result, i.e. a signal having a frequency of the sum and difference of the frequencies of an RF signal and a local oscillator signal. By taking out only the signal that has a frequency of the difference, the IF signal can be obtained.

As used herein, a local oscillator signal refers to a signal output from an oscillator that generates a signal having a frequency substantially equal to the value of frequency-conversion from an IF signal to an RF signal in a radio communication transceiver.

A conventional frequency mixer is formed of a transistor receiving an RF signal at its gate for conversion into a drain current (referred to as RF transconductor), a differential pair including two transistors, receiving differential local oscillator signals at their gates for conversion into a drain current (referred to as local oscillator signal differential pair), and a load to convert the drain current of the transistors in the local oscillator signal differential pair into a voltage to obtain an IF signal.

The drain of the transistor in the RF transconductor is connected in common with the sources of the two transistors in the local oscillator signal differential pair. Furthermore, two loads are connected to the respective drains of the two transistors in the local oscillator signal differential pair.

In accordance with such a configuration, the transistor of the RF transconductor converts the RF signal into a drain current. The current path thereof is switched by the two transistors of the local oscillator signal differential pair in response to the local oscillator signal applied to respective gates, whereby the multiplied result of the RF signal and the local oscillator signal appears as the differential IF signal at the two loads to be output.

Furthermore, the frequency mixer is configured to allow the drain current of the transistor in the local oscillator signal differential pair to be reduced by compensating for a portion of the drain current of the transistor in the RF transconductor through a constant-current source (for example, refer to IEEE J. Solid-State Circuits, Vol. 35, No. 12, pp. 1927-1933, referred to as Document 1 hereinafter; and IEEE J. Solid-State Circuits, Vol. 38, No. 1, pp. 30-42, referred to as Document 2 hereinafter).

Thus, the frequency mixer disclosed in Documents 1 and 2 can reduce the drain current of the transistors in the local oscillator signal differential pair that is required to conduct a current flow to the drain of the transistor in the RF transconductor.

Even in the case where the gate-source voltage of the transistor in the local oscillator signal differential pair is smaller, i.e. when a local oscillator signal of smaller amplitude is input, the frequency conversion operation described in the foregoing can be carried out, allowing the linearity in the local oscillator signal differential pair to be improved, i.e. improvement of linearity in the relationship between the local oscillator signal (input) in the local oscillator signal differential pair and the drain current (output) of the transistor in the local oscillator signal differential pair.

At a point in time where the momentary voltage of the RF input signal, when having a large amplitude, is small in the frequency mixer disclosed in Documents 1 and 2, the gate voltage of the transistor in the RF transconductor will become extremely low. Therefore, there are occasions where the drain current of that transistor (the output current of the RF transconductor) becomes smaller than the current of the constant current source. In order to reduce the current flowing to the drain of the transistor in the RF transconductor (input current of the RF transconductor) at this stage, the potential at the connection node among the drain of the transistor in the RF transconductor, the constant current source, and the sources of the transistors in the local oscillator signal differential pair rises. In response, the gate-source voltage of the transistor in the local oscillator signal differential pair is reduced, whereby the transistor in the local oscillator signal different pair is turned off such that the drain current of that transistor becomes 0. As a result, no current will flow to the load connected to the drain of the transistor in the local oscillator signal differential pair, and the IF signal will be fixed in voltage.

Thus, the frequency mixer disclosed in Documents 1 and 2 had the disadvantage that the linearity of the local oscillator signal differential pair is degraded when the amplitude of the RF input signal is large.

SUMMARY OF THE INVENTION

An object of the present invention is to provide a frequency mixer that does not have the linearity of the local oscillator signal differential pair degraded even when the RF input signal has a large amplitude.

According to an aspect of the present invention, a frequency mixer includes a first MOS transistor, a local oscillator signal differential pair formed of second and third MOS transistors having substantially the same properties, a first load, a second load, and a control circuit. The first MOS transistor receives an RF signal at its gate. The second and third MOS transistors have their sources connected, and a connection node thereof is connected to the drain of the first MOS transistor. The second MOS transistor receives a local oscillator signal at its gate, and has its drain connected to the first load. The third MOS transistor receives an inverted local oscillator signal at its gate, and has its drain connected to the second load. An IF signal is output from the drain of the second MOS transistor. An inverted IF signal is output from the drain of the third MOS transistor. The first load and the second load are connected to a fixed potential. The control circuit receives an RF signal and outputs a current to the drain of the first MOS transistor to decrease monotonously the current with respect to the amplitude of the RF signal.

Degradation of the linearity of the local oscillator signal differential pair can be prevented even in the case where the RF input signal has a large amplitude.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 6A, 6B and 6C represent an output current If when the RF input signal has a small amplitude, a moderately large amplitude (intermediate level), and a sufficiently large amplitude, respectively.

FIGS. 12A, 12B, and 12C represent an output current If when the RF input signal has a small amplitude, a moderately large amplitude (intermediate level), and a sufficiently large amplitude, respectively.

DESCRIPTION OF THE PREFERRED EMBODIMENTS

The frequency mixer disclosed in Documents 1 and 2 will be first described with reference to the drawings, for comparison with the frequency mixer of the present invention.

[Configuration of Frequency Mixer of Documents 1 and 2]

Figure 1:
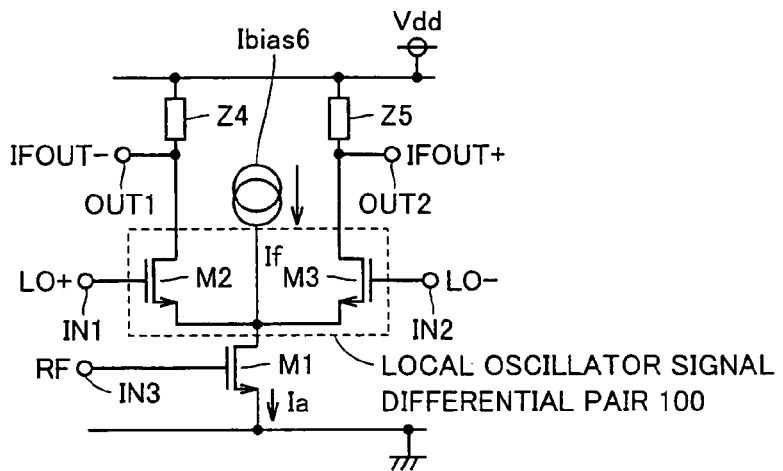
FIG. 1 represents a schematic configuration of a frequency mixer disclosed in Documents 1 and 2.

Referring to FIG. 1, a frequency mixer disclosed in Documents 1 and 2 includes an N channel MOS transistor M1, N channel MOS transistors M2 and M3 constituting a local oscillator signal differential pair 100, a load Z4, a load Z5, and a constant current source Ibias6.

N channel MOS transistor M2 and N channel MOS transistor M3 have substantially the same properties. Specifically, the same properties refer to equal threshold voltage, gain constant, mutual conductance when equal current flows, and drain resistance.

A first output terminal OUT1 and load Z4 are connected to the drain of N channel MOS transistor M2.

A second output terminal OUT2 and load Z5 are connected to the drain of N channel MOS transistor M3.

N channel MOS transistors M2 and M3 have their sources connected, and the connection node thereof is connected to the drain of N channel MOS transistor M1.

N channel MOS transistors M1, M2 and M3 have their gates connected to a third input terminal IN3, first input terminal IN1, and a second input terminal IN2, respectively.

N channel MOS transistor M1 has its source connected to a first fixed potential (ground potential).

Load Z4 has one end connected to a second fixed potential Vdd and the other end connected to first output terminal OUT1.

Load Z5 has one end connected to second fixed potential Vdd and the other end connected to second output terminal OUT2.

A constant current source Ibias6 is connected to the connection node of the drain of N channel MOS transistor M1, the source of N channel MOS transistor M2, and the source of N channel MOS transistor M3.

The drain current of N channel MOS transistor M1 is identified as Ia, and constant current source Ibias6 outputs a constant current If.

[Operation of Frequency Mixer Disclosed in Documents 1 and 2]

The operation of the frequency mixer of Documents 1 and 2 will be described hereinafter. It is assumed that all the transistors operate in a saturation region.

A differential local oscillator signal LO+ and an inverted local oscillator signal LO− are applied to input terminals IN1 and IN2. An RF input signal is applied to third input terminal IN3.

N channel MOS transistor M1 converts the RF input signal into a drain current Ia, and the current path thereof is switched in response to local oscillator signal LO+ and inverted local oscillator signal LO− by N channel MOS transistors M2 and M3, whereby the multiplied results of the RF input signal by respective signals of local oscillator signal LO+ and inverted local oscillator signal LO− are output as an inverted output signal IFOUT− and an output signal IFOUT+ to output terminals OUT1 and OUT2.

Figure 2A:
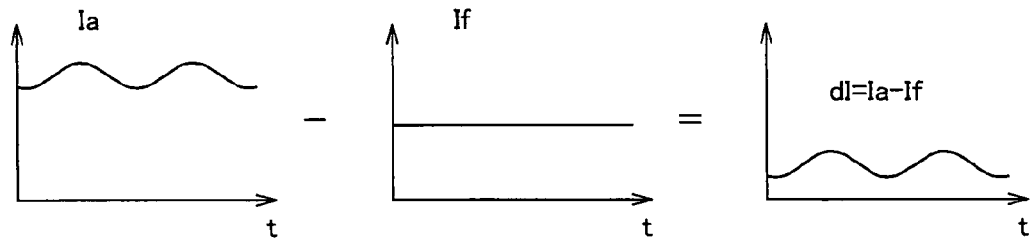
FIGS. 2A and 2B represent the relationship of a drain current Ia, a constant current If, and a difference dI therebetween of the frequency divider disclosed in Documents 1 and 2, corresponding to an RF input signal having a small amplitude and a large amplitude, respectively.
Figure 2B:
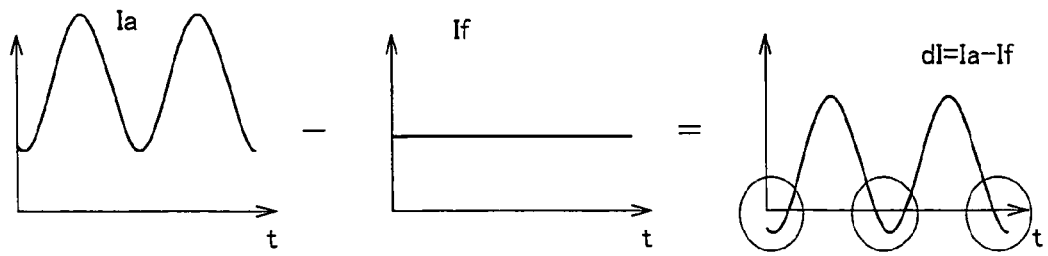

FIGS. 2A and 2B represent the relationship of drain current Ia, constant current If and difference dI therebetween of N channel MOS transistor M1 in the present frequency mixer.

The aforementioned relationship is as shown in FIG. 2A when the amplitude of the RF input signal is small.

Since drain current Ia of N channel MOS transistor M1 varies in accordance with the voltage value of the RF input signal applied to the gate of the transistor thereof, the amplitude of drain current Ia of N channel MOS transistor M1 becomes smaller when the RF input signal has a small amplitude. In this case, drain current Ia is constantly larger than constant current If. Since dI>0 is constantly established, the frequency mixer operates properly.

The relationship of drain current Ia, constant current If, and difference dI therebetween is as shown in FIG. 2B when the amplitude of the RF input signal is large.

Since drain current Ia of N channel MOS transistor M1 varies in accordance with the voltage value of the RF input signal applied to the gate of the transistor thereof, the amplitude of drain current Ia of N channel MOS transistor M1 becomes larger when the amplitude of the RF input signal is large. Accordingly, at a point in time when the momentary voltage of the RF input signal becomes small, i.e., when drain current Ia of N channel MOS transistor M1 decreases, drain current Ia will become lower than output current If of constant current source Ibias6, corresponding to the case where dI becomes negative (indicated by the circles in FIG. 2B).

In order to reduce the current flowing to the drain of N channel MOS transistor M1 at this stage, the potential at the connection node of the drain of N channel MOS transistor M1, the source of N channel MOS transistor M2 and the source of N channel MOS transistor M3 of local oscillator signal differential pair 100 rises. Accordingly, the gate-source voltage of N channel MOS transistor M2 and N channel MOS transistor M3 in local oscillator signal differential pair 100 is reduced, whereby these transistors are turned off. The drain current of these transistors becomes 0. As a result, no current will flow to loads Z4 and Z5, such that inverted output signal IFOUT− and output signal IFOUT+ are held at a fixed voltage (second fixed potential Vdd).

Thus, when the RF input signal has a large amplitude in the frequency mixer disclosed in Documents 1 and 2, the linearity of the local oscillator signal differential pair, i.e. the linearity of the relationship between local oscillator signal LO+ and inverted local oscillator signal LO− (input), and the drain current of N channel MOS transistors M2 and M3 (output) is degraded to aggravate the noise characteristics.

Embodiments of the present invention will be described hereinafter with reference to the drawings.

First Embodiment

The first embodiment of the present invention relates to a frequency mixer functioning to control appropriately, in accordance with the amplitude of an RF input signal applied to the gate of a transistor for conversion into a drain current, the current to be conducted to the drain of that transistor in order to compensate for a portion of the drain current.

[Configuration]

Figure 3:
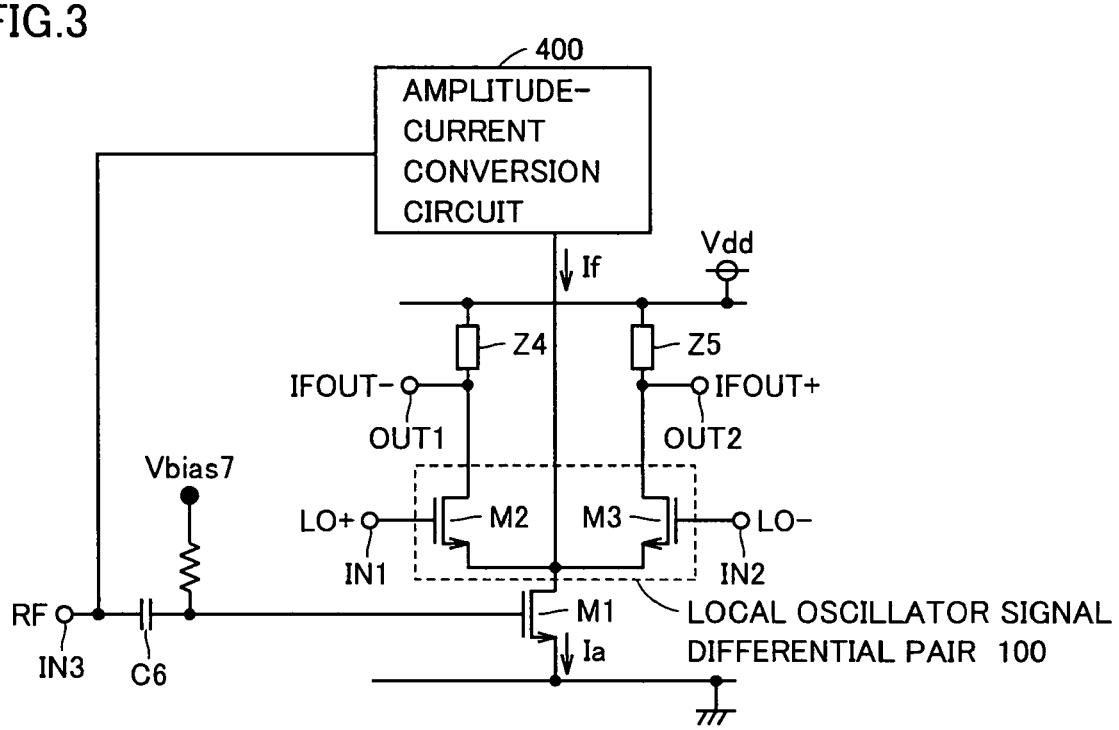
FIG. 3 represents a configuration of a frequency mixer according to a first embodiment.

Referring to FIG. 3, a frequency mixer according to the first embodiment includes, likewise the frequency mixer disclosed in Documents 1 and 2 in FIG. 1, N channel MOS transistor M1 (first MOS transistor), N channel MOS transistor M2 (second MOS transistor) and N channel MOS transistor M3 (third MOS transistor) constituting local oscillator signal differential pair 100, load Z4 (first load), and load Z5 (second load). N channel MOS transistors M2 and M3 have substantially the same properties.

The frequency mixer of the present embodiment additionally has an amplitude-current conversion circuit 400, a capacitor C6, and a constant voltage source Vbias7 provided with respect to the frequency mixer of Documents 1 and 2.

First output terminal OUT1 and load Z4 are connected to the drain of N channel MOS transistor M2.

Second output terminal OUT2 and load Z5 are connected to the drain of N channel MOS transistor M3.

N channel MOS transistors M2 and M3 have their sources connected. The connection node thereof is connected to the drain of N channel MOS transistor M1.

Third input terminal IN3, first input terminal IN1 and second input terminal IN2 are connected to the gates of N channel MOS transistors M1, M2 and M3, respectively.

N channel MOS transistor M1 has its source connected to the first fixed potential (ground potential).

Load Z4 has one end connected to the second fixed potential Vdd and the other end connected to first output terminal OUT1. Load Z5 has one end connected to second fixed potential Vdd and the other end connected to second output terminal OUT2.

Constant voltage source Vbias7 and capacitor C6 are connected to the gate of N channel MOS transistor M1.

Capacitor C6 is connected to input terminal IN3.

Amplitude-current conversion circuit 400 has its input connected to first input terminal IN3, and its output connected to the connection node of the source of N channel MOS transistor M2, the source of N channel MOS transistor M3, and the drain of N channel MOS transistor M1.

The drain current of N channel MOS transistor M1 is identified as Ia.

The current flowing from amplitude-current conversion circuit 400 to the connection node of the source of N channel MOS transistor M2, the source of N channel MOS transistor M3, and the drain of N channel MOS transistor M1 is identified as If.

Capacitor C6 functions to eliminate the influence on a direct current potential from an external circuit. Constant voltage source Vbias7 functions to apply an appropriate potential to the RF input signal, and causes N channel MOS transistor M1 to perform a desired operation.

[Operation]

It is assumed that all the transistors operate in a saturation region.

The frequency mixer of the first embodiment has an amplitude-current conversion circuit 400 provided instead of constant current source Ibias6 in the frequency mixer of Documents 1 and 2 shown in FIG. 1. The operation of the frequency mixer of the first embodiment is similar to that of the frequency mixer of FIG. 1, except for the operation of amplitude-current conversion circuit 400.

Amplitude-current conversion circuit 400 functions to decrease monotonously output current If with respect to the amplitude of the RF input signal. Specifically, amplitude-current conversion circuit 400 functions to reduce and increase output current If when the RF input signal has a large amplitude and a small amplitude, respectively.

As used herein, "decrease monotonously" refers to a relationship in which a function f(x) satisfies f(a)≧f(b) and f(A)>f(B) with respect to arbitrary a and b where A<a<b<B. In other words, there may be a zone where f(x) is constant in the range of A to B, where x is the amplitude of the RF input signal, A is the minimum value of the amplitude of the RF input signal, B is the maximum value of the amplitude of the RF input signal, and f(x) is the output current If.

Figure 4A:
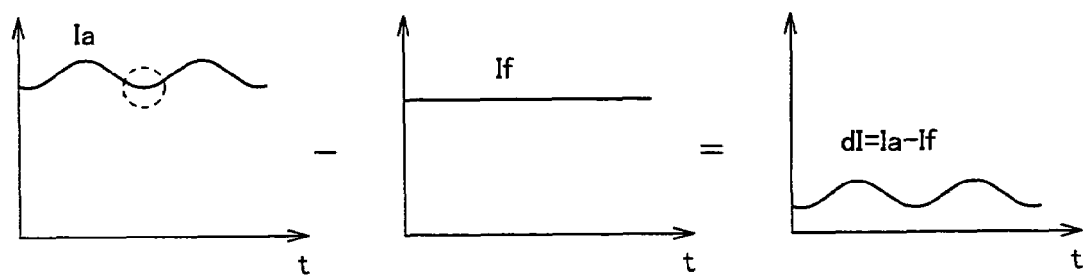
FIGS. 4A and 4B represent the relationship of a drain current Ia, a constant current If, and a difference dI therebetween of the frequency divider of the first embodiment, corresponding to an RF input signal having a small amplitude and a large amplitude, respectively.
Figure 4B:
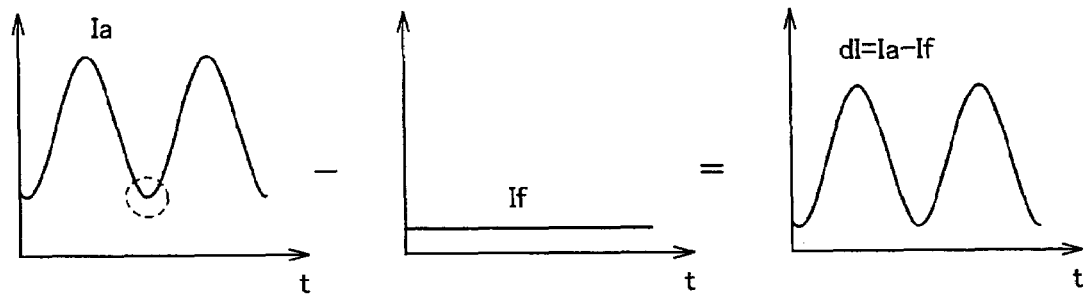

FIGS. 4A and 4B represent the relationship of output current If of amplitude-current conversion circuit 400 and drain current Ia of N channel MOS transistor M1 in the frequency mixer of the first embodiment. As used herein, dI is the difference between drain current Ia of N channel MOS transistor M1 and output current If.

It is appreciated from FIGS. 4A and 4B that, when the RF input signal has a small amplitude, the minimum value of the momentary voltage of the RF input signal becomes larger as compared to the case where the RF input signal has a large amplitude, such that the minimum value of the momentary current of drain current Ia of N channel MOS transistor M1 becomes higher, as compared to the case where the RF input signal has a large amplitude. (The circle in FIG. 4A)

At this stage, amplitude-current conversion circuit 400 functions to increase output current If since the RF input signal has a small amplitude. Amplitude-current conversion circuit 400 is adapted to prevent output current If from becoming larger than drain current Ia even when the momentary current of drain current Ia of N channel MOS transistor M1 is smallest (the circle in FIG. 4A) to maintain the relationship of dI>0 (FIG. 4A).

When the RF input signal has a large amplitude and the momentary voltage of the RF input signal is at the minimum, the minimum value of the momentary current of drain current Ia of N channel MOS transistor M1 becomes smaller as compared to the case where the RF input signal has a small amplitude (the circle in FIG. 4B).

At this stage, amplitude-current conversion circuit 400 functions to reduce output current If since the RF input signal has a large amplitude. Accordingly, drain current Ia of N channel MOS transistor M1 becomes larger than output current If even when the momentary current thereof becomes smallest (the circle in FIG. 4B), and maintains the relationship of dI>0 (refer to FIG. 4B).

In the frequency mixer disclosed in Documents 1 and 2, dI<0 is established at the point in time of low momentary voltage of the RF input signal when the RF input signal has a large amplitude. The drain current of the transistor in the local oscillator signal differential pair will become 0 such that the IF signal attains a fixed voltage, resulting in degradation of the linearity of the local oscillator signal differential pair. In contrast, the linearity of local oscillator signal differential pair 100 will not be degraded in the frequency mixer of the present embodiment since dI<0 is not established even when the RF input signal has a large amplitude (FIG. 4B).

The frequency mixer of the present embodiment can maintain the advantages achieved by the frequency mixer of Documents 1 and 2 since the output current If can be increased/decreased in accordance with the amplitude of the RF input signal.

In the frequency mixer of Documents 1 and 2 in which the drain current of the transistor in the local oscillator signal differential pair is decreased by compensating for a portion of the drain current of the transistor in the RF transconductor through a constant-current source, a desired frequency conversion operation can be carried out the and the linearity of the local oscillator signal differential pair can be improved, even when a local oscillator signal having a smaller amplitude is input. In contrast, the frequency mixer of the present embodiment functions to decrease and increase output current If when the RF input signal has a large amplitude and a small amplitude, respectively. Therefore, with regards to output current If that compensates for a portion of the drain current of transistor M1, nullification of the above-described advantage of compensation caused by the output current If becoming smaller than required can be prevented.

The relationship between output current If of amplitude-current conversion circuit 400 and drain current Ia of N channel MOS transistor M1 must always satisfy If<Ia, i.e. dI>0 within the possible range of the amplitude of the RF input signal, including the maximum or minimum amplitude of the RF input signal. In the present embodiment, this relationship can be satisfied by adjusting the bias voltage and the value of respective elements in the frequency mixer.

Second Embodiment

The second embodiment relates to a frequency mixer including an amplitude-current conversion circuit 500 that is exemplary of amplitude-current conversion circuit 400 of the first embodiment.

[Configuration]

Figure 5:
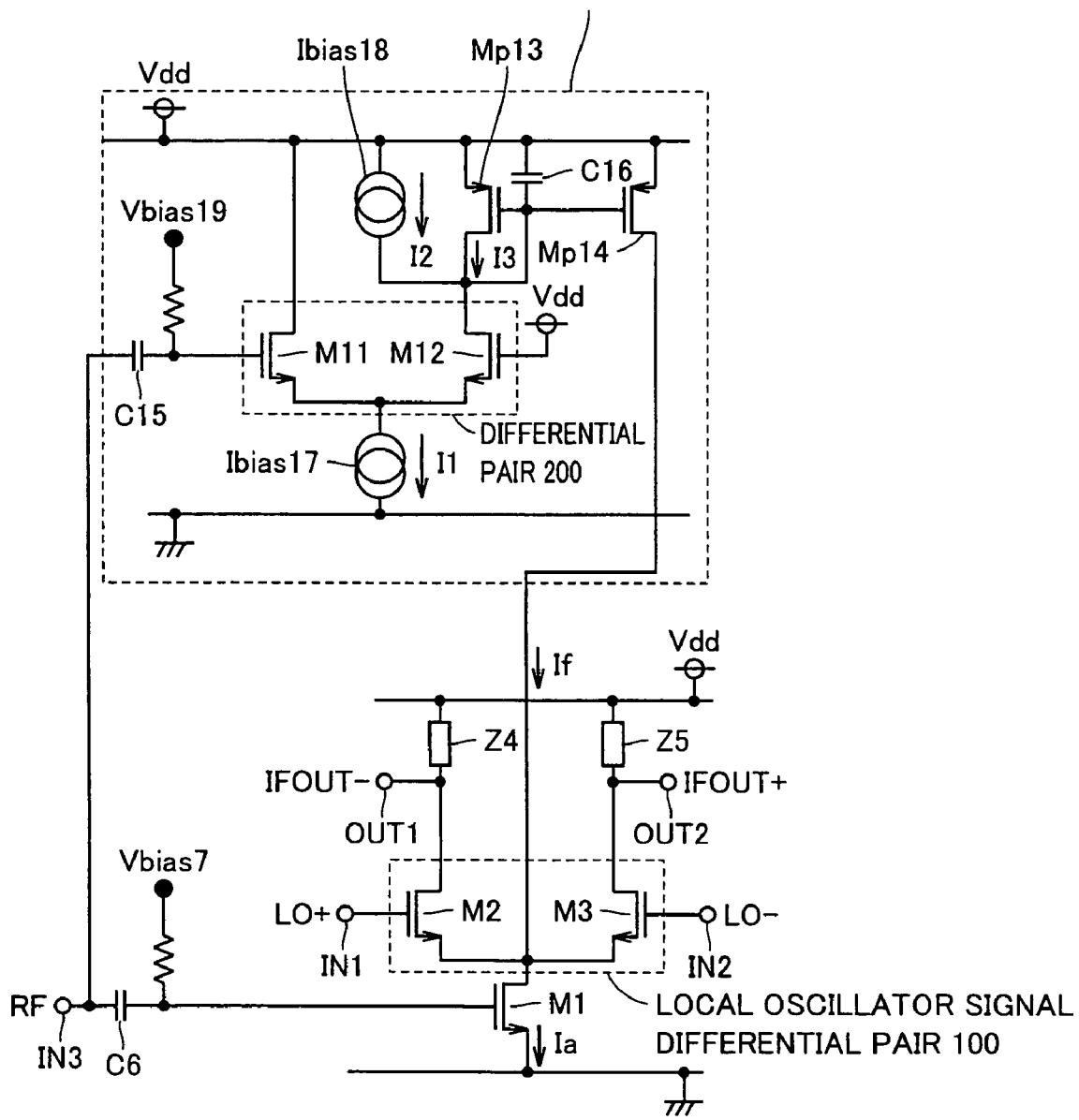
FIG. 5 represents a configuration of a frequency mixer according to a second embodiment.

Referring to FIG. 5, a frequency mixer of the second embodiment includes, likewise the first embodiment, N channel MOS transistor M1 (first MOS transistor), N channel MOS transistor M2 (second MOS transistor) and N channel MOS transistor M3 (third MOS transistor) constituting local oscillator signal differential pair 100, load Z4 (first load), load Z5 (second load), capacitor C6 (first capacitor), constant voltage source Vbias7, and an amplitude-current conversion circuit 500.

N channel MOS transistors M2 and M3 have substantially the same properties.

All the connection is similar to that of the first embodiment except for amplitude-current conversion circuit 500.

Amplitude-current conversion circuit 500 includes an N channel MOS transistor M11 (fourth MOS transistor) and an N channel MOS transistor M12 (fifth MOS transistor) constituting a differential pair 200, a P channel MOS transistor Mp13 (sixth MOS transistor), a P channel MOS transistor Mp14 (seventh MOS transistor), a capacitor C15, a capacitor C16 (first capacitor), a constant current source Ibias17 (first constant current source), a constant current source Ibias18 (second constant current source), and a constant voltage source Vbias19.

N channel MOS transistors M11 and M12 have substantially the same properties. P channel MOS transistors Mp13 and Mp14 have substantially the same properties. P channel MOS transistor Mp13 and P channel MOS transistor Mp14 constitute a current mirror circuit.

The drain current of N channel MOS transistor M1 is identified as Ia. The drain current of P channel MOS transistor Mp13 is identified as I3. Constant current source Ibias17 outputs a constant current I1. Constant current source Ibias18 outputs a constant current I2 (here, I2=I1/2; the reason thereof will be described afterwards). Constant voltage source Vbias19 outputs a constant voltage Vbs19.

Second fixed potential Vdd is connected to the drain of N channel MOS transistor M11, the gate of N channel MOS transistor M12, the source of P channel MOS transistor Mp13, the source of P channel MOS transistor Mp14, capacitor C16, and constant current source Ibias18.

N channel MOS transistors M11 and M12 have their sources connected. The connection node thereof is connected to constant current source Ibias17.

N channel MOS transistor M11 has its gate connected to constant voltage source Vbias19 and capacitor C15.

P channel MOS transistor Mp13 has its gate connected to the drain of P channel MOS transistor Mp13. P channel MOS transistor Mp13 has its gate further connected to the gate of P channel MOS transistor Mp14. The connection node thereof is connected to capacitor C16, constant current source Ibias18, and the drain of N channel MOS transistor M12.

Input terminal IN3 is connected to capacitor C15.

P channel MOS transistor Mp14 has its drain connected to the connection node of the source of N channel MOS transistor M2, the source of N channel MOS transistor M3, and the drain of N channel MOS transistor M1.

[Operation]

It is assumed that all the transistors operate in a saturation region.

The frequency mixer of the second embodiment is directed to a further exemplification of amplitude-current conversion circuit 400 of the first embodiment. Therefore, all the operation is similar to that of the first embodiment except for the internal operation of amplitude-current conversion circuit 500.

Thus, the operation of amplitude-current conversion circuit 500 will be described hereinafter.

FIGS. 6A-6C represent the relationship of gate-source voltage Vgs of N channel MOS transistor M11, threshold voltage Vth of N channel MOS transistor M11, constant voltage Vbs (output voltage Vbs19 of constant voltage source Vbias19), drain current I3, and output current If in amplitude-current conversion circuit 500.

It is appreciated from FIGS. 6A-6C that N channel MOS transistor M11 is constantly OFF when the RF input signal has a small amplitude and gate-source voltage Vgs of N channel MOS transistor M11 does not exceed threshold voltage Vth of N channel MOS transistor M11 (FIG. 6A).

Since constant current source Ibias17 provides an output current I1 and constant current source Ibias18 provides output current I2 that is I1/2 at this stage, the drain current I3 of P channel MOS transistor Mp13 attains the level of I1/2, including only a direct current component. It is to be noted that P channel MOS transistors Mp13 and Mp14 constitute a current mirror circuit and have substantially the same properties. Therefore, the drain current of P channel MOS transistor Mp14 attains the level of I1/2. In other words, amplitude-current conversion circuit 500 provides an output current If of I1/2.

When the amplitude of the RF input signal is increased to some level, and the gate-source voltage Vgs of N channel MOS transistor M11 exceeds threshold voltage Vth of N channel MOS transistor M11 (FIG. 6B), N channel MOS transistor M11 is turned ON periodically. The ON period is shorter than half the period of the RF input signal.

At this stage, the drain current of N channel MOS transistor M11 begins to flow periodically. Drain current I3 of P channel MOS transistor Mp13 is decreased periodically from I1/2. Therefore, drain current I3 of P channel MOS transistor Mp13 has a direct current component and an alternating current component.

At this stage, the gate voltage of P channel MOS transistor Mp13 has a direct current component and an alternating current component corresponding to drain current I3. Since that alternating current component is cut off by a lowpass filter formed of the output resistance (mutual conductance and drain-source resistance) of P channel MOS transistor Mp13 and capacitor C16, the gate-source voltage of P channel MOS transistor Mp14 includes only the direct current component of the gate-source voltage of P channel MOS transistor Mp13. Therefore, the drain current of P channel MOS transistor Mp14, i.e. output current If of amplitude-current conversion circuit 500 is decreased from I1/2, and includes only the direct current component.

When the amplitude of the RF input signal is sufficiently large (FIG. 6C), and gate-source voltage Vgs of N channel MOS transistor M11 sufficiently exceeds threshold voltage Vth of N channel MOS transistor M11 for approximately half the period of the RF input signal, the ON period of N channel MOS transistor M11 becomes longer. N channel MOS transistor M11 repeats an ON state and an OFF state for substantially every half period of the RF input signal.

At this stage, drain current I3 of P channel MOS transistor Mp13 attains the level of I1/2 as set forth above when N channel MOS transistor M11 is OFF. When N channel MOS transistor M11 is ON, gate-source voltage Vgs of N channel MOS transistor M11 sufficiently exceeds threshold voltage Vth of N channel MOS transistor M11, and constant current source Ibias17 provides an output current of I1. Therefore, the drain current of N channel MOS transistor M11 and the drain current of N channel MOS transistor M12 equally become I1/2. Since output current I2 of constant current source Ibias18 is I1/2, drain current I3 of P channel MOS transistor Mp13 attains the level of 0. Therefore, drain current I3 of P channel MOS transistor Mp13 repeats I1/2 and 0 for substantially every half period of the RF input signal, and does not include a direct current component.

Although the gate voltage of P channel MOS transistor Mp13 includes only an alternating current component corresponding to drain current I3 of P channel MOS transistor Mp13, the gate-source voltage of P channel MOS transistor Mp14 becomes 0 since the output resistance (mutual conductance and drain-source resistance) of P channel MOS transistor Mp13 and capacitor C16 constitute a lowpass filter. Thus, the drain current of P channel MOS transistor Mp14, i.e. output current If of amplitude-current conversion circuit 500 becomes 0. The remaining operation is similar to that of the first embodiment.

It is assumed that amplitude-current conversion circuit 500 operates under the conditions set forth below.

Condition 1: Vbs19<Vdd

This is because, if the gate voltage of N channel MOS transistor M11 is too high, an OFF state thereof cannot be achieved. Amplitude-current conversion circuit 500 cannot operate as set forth above.

Condition 2: I2=I1/2

This is to remove the direct current component of drain current I3 of P channel MOS transistor Mp13 by causing the drain current of N channel MOS transistor M11 to become I1/2 periodically, i.e. causing drain current I3 of P channel MOS transistor Mp13 to become 0 periodically, when the amplitude of the RF input signal is large enough, i.e. when in the case of FIG. 6C.

Condition 3: Capacitor C16 is sufficiently large, i.e. the impedance is small enough at the frequency of the RF input signal.

This is to cut the alternating current component of the gate voltage of P channel MOS transistor Mp13 through the lowpass filter formed of the output resistance of P channel MOS transistor Mp13 (mutual conductance and drain-source resistance) and capacitor C16 in order to remove the alternating current component of the gate-source voltage of P channel MOS transistor Mp14.

The relationship between the amplitude of the RF input signal (VRF) and output current If of amplitude-current conversion circuit 500 illustrated in FIG. 7 will be described hereinafter in comparison with FIG. 6.

Figure 7:
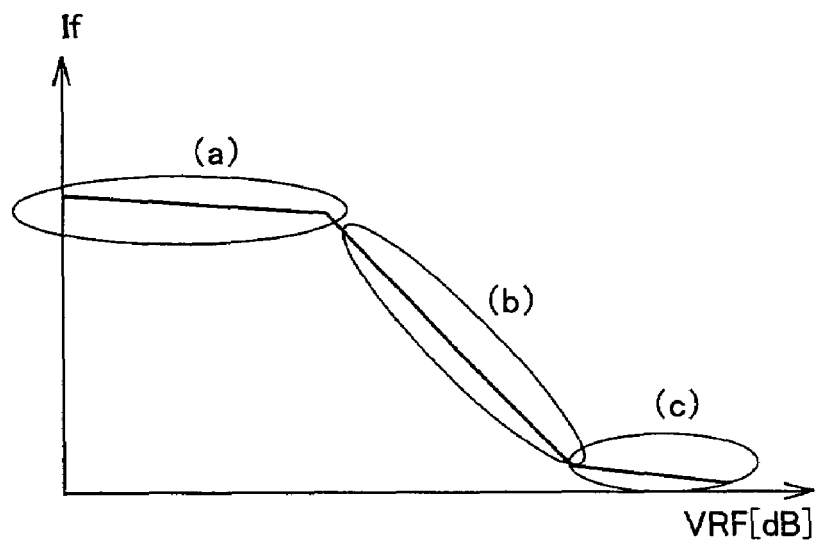
FIG. 7 represents output current If with respect to the amplitude of an RF input signal in an amplitude-current conversion circuit 500 of the frequency mixer of the second embodiment.

Referring to FIG. 7, when the amplitude of the RF input signal gradually increases such that gate-source voltage Vgs of N channel MOS transistor M11 exceeds threshold voltage Vth of N channel MOS transistor M11, i.e. at the stage from the state of FIG. 6A towards the state of FIG. 6B, increase of the drain current of N channel MOS transistor M11 is gentle with respect to the increase of the amplitude of the RF input signal since the drain current of N channel MOS transistor M11 is small, and the ON period of N channel MOS transistor M11 is short. Accordingly, the drain current of N channel MOS transistor M12, i.e., the gate-source voltage of P channel MOS transistor Mp14 decreases gently with respect to the increase of the amplitude of the RF input signal. Output current If decreases with a gentle inclination (FIG. 7(a)).

When the amplitude of the RF input signal further increases such that the duration of gate-source voltage Vgs of N channel MOS transistor M11 exceeding threshold voltage Vth of N channel MOS transistor M11 approximates substantially half the period of the RF input signal, i.e. at the stage from the state of FIG. 6B towards the state of FIG. 6C, the increase of the drain current of N channel MOS transistor M11 is abrupt with respect to the increase of the amplitude of the RF input signal since the drain current of N channel MOS transistor M11 increases and the ON period of N channel MOS transistor M11 becomes longer. Accordingly, the drain current of N channel MOS transistor M12, i.e. the gate-source voltage of P channel MOS transistor Mp14 decreases abruptly with respect to the increase of the amplitude of the RF input signal. Output current If decreases with an abrupt inclination (FIG. 7(b)).

When the amplitude of the RF input signal is large enough and gate-source voltage Vgs of N channel MOS transistor M11 is sufficiently higher with respect to threshold voltage Vth of N channel MOS transistor M11, i.e. at the stage of FIG. 6C, the drain current of N channel MOS transistor M11 increases gently with respect to the increase of the amplitude of the RF input signal since the drain current of N channel MOS transistor M11 hardly becomes higher and the ON period of N channel MOS transistor M11 hardly increases.

Accordingly, the drain current of N channel MOS transistor M12, i.e. the gate-source voltage of P channel MOS transistor Mp14 decreases gently with respect to the increase of the amplitude of the RF input signal. Output current If decreases with a gentle inclination again to approach 0 (FIG. 7(c)).

Thus, amplitude-current conversion circuit 500 of the second embodiment functions to decrease monotonously output current If with respect to the amplitude of the RF input signal, i.e. decrease and increase output current If when the amplitude of the RF input signal is large and small, respectively.

In accordance with the frequency mixer of the second embodiment, degradation of the linearity of local oscillator signal differential pair 100 can be prevented, as in the first embodiment, and the advantage achieved by the frequency mixer of Documents 1 and 2 can be maintained. In other words, a desired frequency conversion operation can be carried out, and the linearity of the local oscillator signal differential pair can be improved, even when a local oscillator signal of smaller amplitude is input.

Third Embodiment

The third embodiment of the present invention relates to a frequency mixer including an amplitude-current conversion circuit 600 with an output signal IFOUT+ and an inverted output signal IFOUT− as the input of the amplitude-current conversion circuit corresponding to the first embodiment.

[Configuration]

Figure 8:
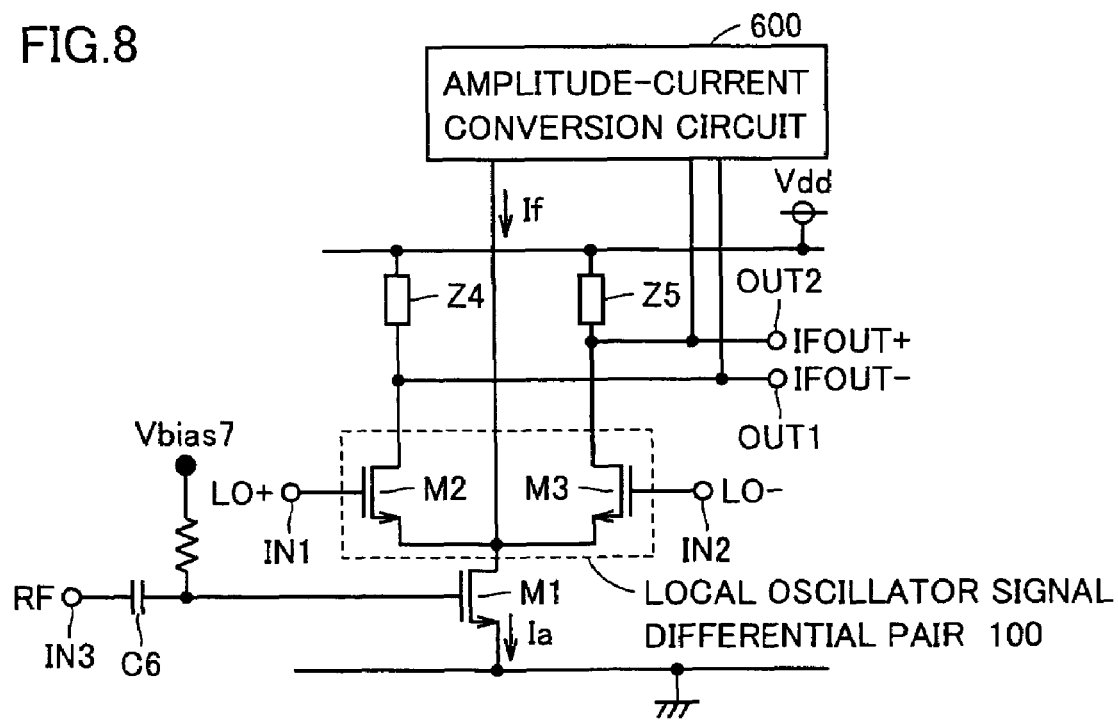
FIGS. 8, 9, 10 and 11 represent a configuration of a frequency mixer according to a third embodiment, a fourth embodiment, a fifth embodiment, and a sixth embodiment, respectively.

Referring to FIG. 8, the frequency mixer of the third embodiment has a configuration similar to that of FIG. 1, provided that amplitude-current conversion circuit 600 is connected to an output terminal OUT1 and an output terminal OUT2, as compared to the first embodiment in which amplitude-current conversion circuit 400 is connected to input terminal IN3. The remaining connection is similar to that of the first embodiment.

[Operation]

The operation of the frequency mixer of the third embodiment will be described hereinafter. It is assumed that all the transistors operate in a saturation region.

Amplitude-current conversion circuit 600 functions to decrease monotonously an output current If in accordance with the amplitude of output signal IFOUT+ and inverted output signal IFOUT−. Specifically, amplitude-current conversion circuit 600 is adapted to decrease output current If when the amplitude of output signal IFOUT+ and inverted output signal IFOUT− is large, and increase output current If when the amplitude of output signal IFOUT+ and inverted output signal IFOUT− is small.

As used herein, "decrease monotonously" refers to a relationship in which a function f(x) satisfies f(a)≧f(b) and f(A)>f(B) with respect to arbitrary a and b where A<a<b<B. In other words, there may be a zone in which f(x) is constant in the range of A to B, where x is the amplitude of output signal IFOUT+ and inverted output signal IFOUT−, A is the minimum value of the amplitude of output signal IFOUT+ and inverted output signal IFOUT−, B is the maximum value of the amplitude of output signal IFOUT+ and inverted output signal IFOUT−, and f(x) is the output current If.

The RF input signal correlates with output signal IFOUT+ and inverted output signal IFOUT−. Specifically, since drain current Ia of N channel MOS transistor M1 varies in accordance with the voltage value of the RF input signal applied to the gate of the transistor of N channel MOS transistor M1, the amplitude of drain current Ia of N channel MOS transistor M1 becomes smaller when the RF input signal has a small amplitude. Accordingly, the amplitude of the drain current of N channel MOS transistors M2 and M3 connected to the drain of N channel MOS transistor M1 becomes smaller. Therefore, the amplitude of output signal IFOUT+ and inverted output signal IFOUT− also becomes smaller.

When the RF input signal has a large amplitude, the amplitude of the drain current Ia of N channel MOS transistor M1 also becomes larger. Accordingly, the amplitude of the drain current of N channel MOS transistors M2 and M3 connected to the drain of N channel MOS transistor M1 becomes larger. Therefore, the amplitude of output signal IFOUT+ and inverted output signal IFOUT− also becomes larger.

Thus, an operation similar to that of the frequency mixer of the first embodiment shown in FIG. 4 can be achieved in the present third embodiment even if amplitude-current conversion circuit 600 is applied with differential output signal IFOUT+ and inverted output signal IFOUT− instead of the RF input signal.

The remaining operation is similar to that of the first embodiment.

According to the frequency mixer of the present embodiment, degradation in the linearity of local oscillator signal differential pair 100 can be prevented, as in the first embodiment, and the advantages achieved by the frequency mixer of Documents 1 and 2 can be maintained. In other words, a desired frequency conversion operation can be carried out, and the linearity of the local oscillator signal differential pair can be improved, even when a local oscillator signal of smaller amplitude is input.

The frequency mixer of the present embodiment is further advantageous in that reduction in the conversion gain of output signal IFOUT+ and inverted output signal IFOUT− with respect to the RF input signal due to the addition of amplitude-current conversion circuit 600 can be suppressed more than in the frequency mixer of the first embodiment. This is because, although the signal at the node is attenuated due to increase of the node capacitance by the addition of amplitude-current conversion circuit 600, the attenuation is significant when the frequency is high. Specifically, since output signal IFOUT+ and inverted output signal IFOUT− have a lower frequency than the RF input signal, the attenuation of output signal IFOUT+ and inverted output signal IFOUT− caused by the increase of the node capacitance at output terminals OUT2 and OUT1 in the frequency mixer of the present third embodiment is smaller than the attenuation in the RF input signal caused by the increase of the node capacitance at input terminal IN3 of the frequency mixer of the first embodiment.

Fourth Embodiment

The fourth embodiment relates to a frequency mixer including an amplitude-current conversion circuit 700 that is a further exemplification of amplitude-current conversion circuit 600 of the third embodiment.

[Configuration]

Figure 9:
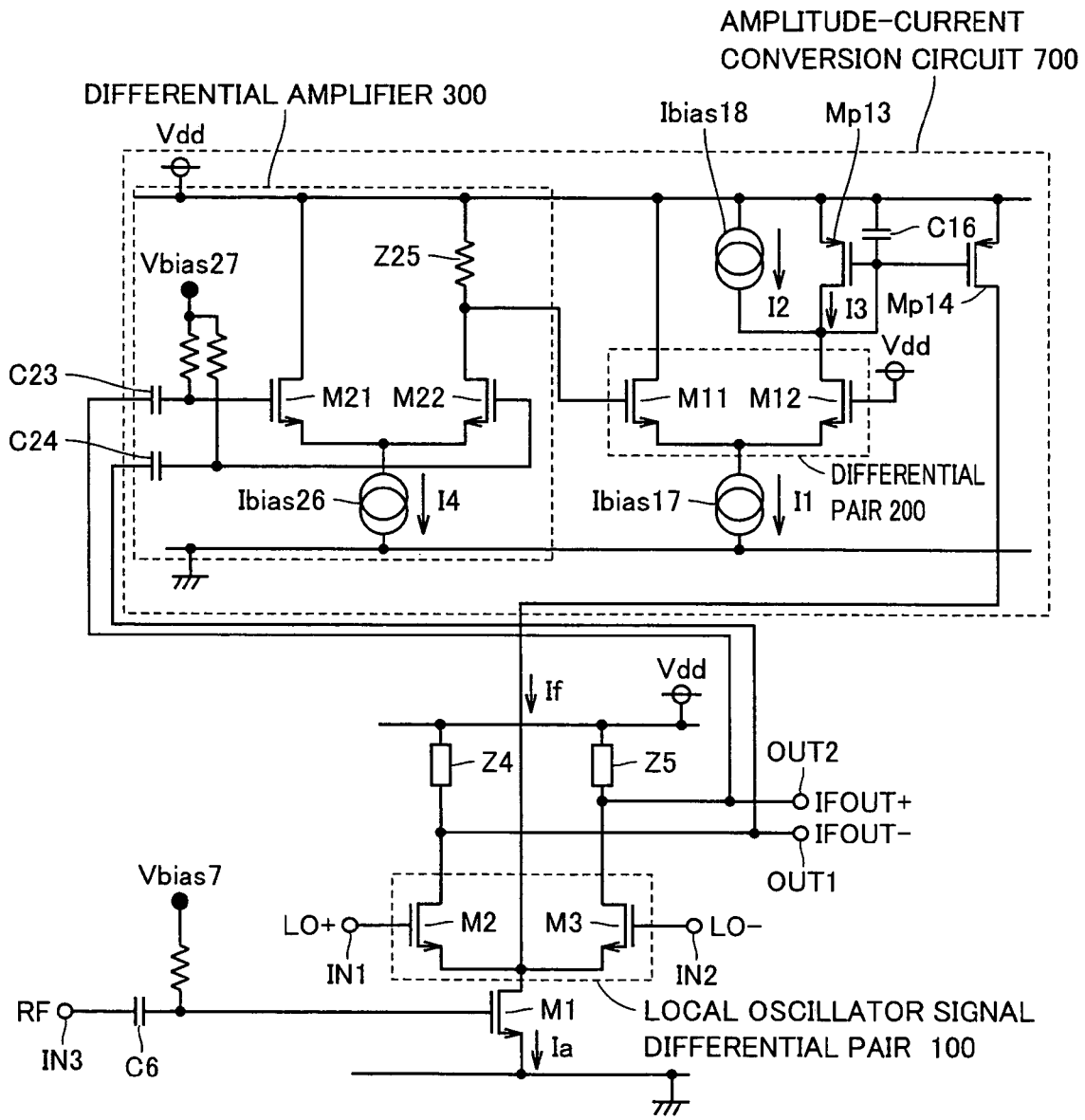

Referring to FIG. 9, the frequency mixer of the fourth embodiment has a configuration similar to that of the third embodiment, provided that amplitude-current conversion circuit 700 is included instead of amplitude-current conversion circuit 600 of the third embodiment.

All the connection is similar to that of the third embodiment except for amplitude-current conversion circuit 700.

Amplitude-current conversion circuit 700 of the frequency mixer of the fourth embodiment has a configuration and connection similar to those of amplitude-current conversion circuit 500 of the second embodiment, with the exception of a differential amplifier 300 connected at a preceding stage of N channel MOS transistor M11 (the fourth MOS transistor).

Differential amplifier 300 of amplitude-current conversion circuit 700 includes an N channel MOS transistor M21 (eighth MOS transistor), an N channel MOS transistor M22 (ninth MOS transistor), a capacitor C23, a capacitor C24, a node Z25 (third load), a constant current source Ibias26 (third constant current source), and a constant voltage source Vbias27. N channel MOS transistors M21 and M22 have substantially the same properties.

Second fixed potential Vdd is connected to the drain of N channel MOS transistor M21 and load Z25.

Load Z25 is connected to the drain of N channel MOS transistor M22. The connection node thereof is connected to the gate of N channel MOS transistor M11.

N channel MOS transistors M21 and M22 have their sources connected. The connection node thereof is connected to constant current source Ibias26.

Constant current source Ibias26 outputs a constant current I4. Constant current source Ibias26 is connected to the first fixed potential (ground potential).

N channel MOS transistor M21 has its gate connected to constant voltage source Vbias 27 and capacitor C23.

N channel MOS transistor M22 has its gate connected to constant voltage source Vbias 27 and capacitor C24.

Output terminal OUT2 is connected to capacitor C23. Output terminal OUT1 is connected to capacitor C24.

Capacitors C23 and C24 function to eliminate the influence on a direct current potential from an external circuit. Constant voltage source Vbias 27 functions to apply an appropriate potential to output signal IFOUT+ and inverted output signal IFOUT− to cause N channel MOS transistor M21 to operate in a desired manner.

[Operation]

The operation of the frequency mixer of the fourth embodiment will be described hereinafter. It is assumed that all the transistors operate in a saturation region.

The frequency mixer of the fourth embodiment is directed to a further exemplification of amplitude-current conversion circuit 600 of the third embodiment. Therefore, all the operation is similar to that of the third embodiment except for the internal operation of amplitude-current conversion circuit 700.

Accordingly, the operation of amplitude-current conversion circuit 700 of the frequency mixer of the fourth embodiment will be described hereinafter.

Differential amplifier 300 applies output signal IFOUT+ to the gate of N channel MOS transistor M21, and inverted output signal IFOUT− to the gate of N channel MOS transistor M22. The current path of output current I4 of constant current source Ibias26 is switched according to output signal IFOUT+ and inverted output signal IFOUT− applied to the gates of N channel MOS transistors M21 and M22, whereby the component of a phase identical to that of output signal IFOUT+ from the components of the difference between output signal IFOUT+ and inverted output signal IFOUT− is applied to one end of load Z25, i.e. the gate of N channel MOS transistor M11.

Amplitude-current conversion circuit 700 of the frequency mixer of the fourth embodiment is similar to amplitude-current conversion circuit 500 of the frequency mixer of the second embodiment, provided that output signal IFOUT+ and inverted output signal IFOUT− are applied to differential amplifier 300 that has its output connected to the gate of N channel MOS transistor M11. Therefore, the operation of amplitude-current conversion circuit 700 is similar to that of amplitude-current conversion circuit 500 of the frequency mixer of the second embodiment, except for the operation of differential amplifier 300.

Thus, amplitude-current conversion circuit 700 functions to decrease monotonously output current If in response to the amplitude of output signal IFOUT+ and inverted output signal IFOUT−. Specifically, amplitude-current conversion circuit 700 is adapted to decrease and increase output current If when the amplitude of output signal IFOUT+ and inverted output signal IFOUT− is large and small, respectively.

According to the frequency mixer of the present embodiment, degradation in the linearity of local oscillator signal differential pair 100 can be prevented, as in the third embodiment, and the advantages achieved by the frequency mixer of Documents 1 and 2 can be maintained. In other words, a desired frequency conversion operation can be carried out, and the linearity of the local oscillator signal differential pair can be improved, even when a local oscillator signal of smaller amplitude is input.

The frequency mixer of the present embodiment is further advantageous in that reduction in the conversion gain of output signal IFOUT+ and inverted output signal IFOUT− with respect to the RF input signal due to the addition of amplitude-current conversion circuit 700 can be suppressed more than in the frequency mixer of the first embodiment.

Fifth Embodiment

The fifth embodiment relates to a frequency mixer including an amplitude-current conversion circuit 800 having the input signal of the frequency mixer of the first embodiment applied as the differential RF input signal, and corresponding to an exemplification of amplitude-current conversion circuit 400.

[Configuration]

Figure 10:
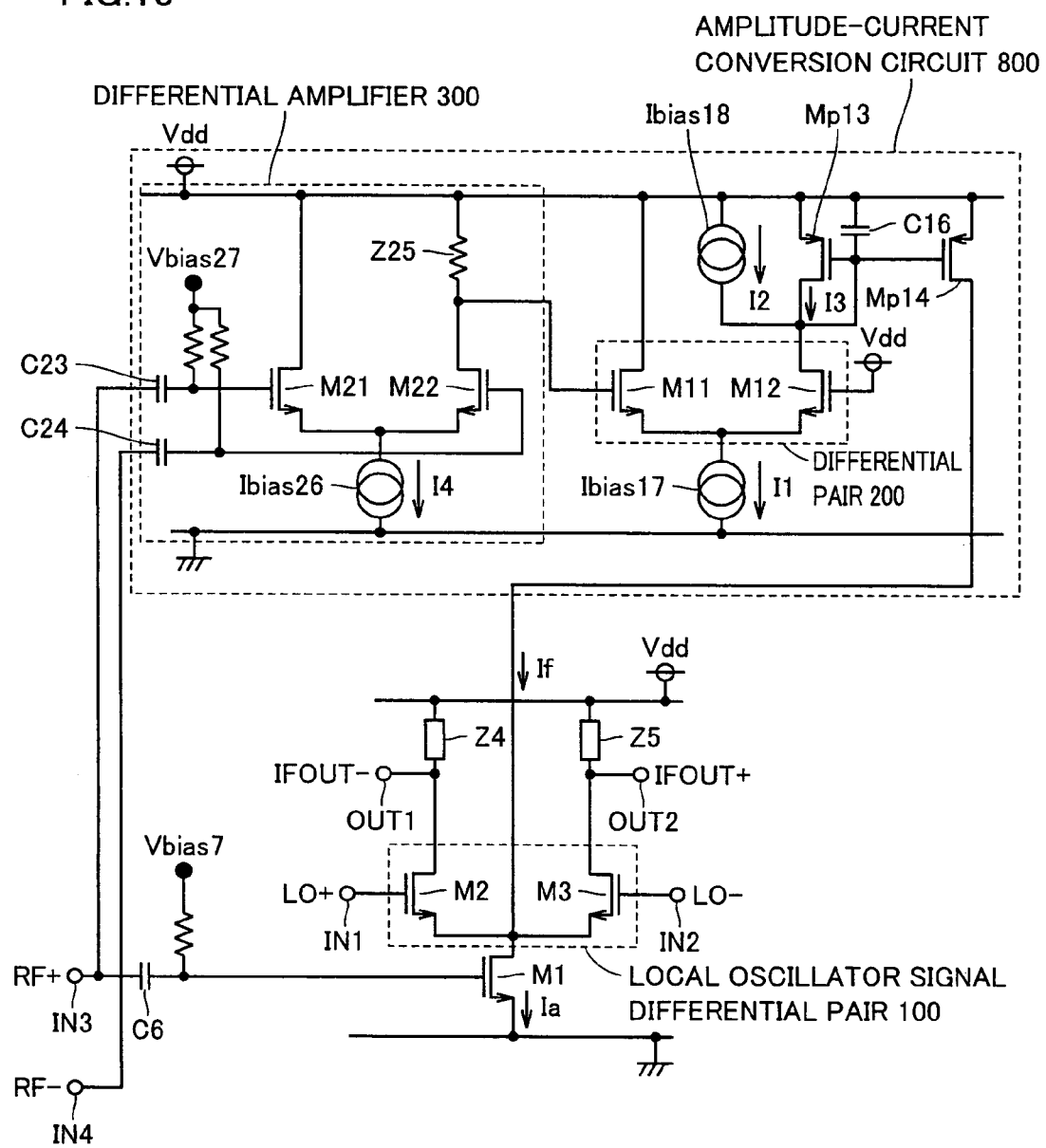

Referring to FIG. 10, the frequency mixer of the fifth embodiment includes an amplitude-current conversion circuit 800 receiving differential RF signals, instead of amplitude-current conversion circuit 400 of the first embodiment. The remaining configuration is similar to that of the first embodiment.

An RF input signal + and an inverted RF input signal − are applied to input terminals IN3 and IN4, respectively. Capacitor C23 and capacitor C24 are connected to input terminals IN3 and IN4, respectively. The remaining connection is similar to that of the first embodiment.

Amplitude-current conversion circuit 800 of the frequency mixer of the fifth embodiment has a configuration similar to that of amplitude-current conversion circuit 700 of the fourth embodiment.

[Operation]

An operation of the frequency mixer of the present fifth embodiment will be described hereinafter. It is assumed that all the transistors operate in a saturation region.

Since the frequency mixer of the fifth embodiment corresponds to the frequency mixer of the first embodiment, based on amplitude-current conversion circuit 800 with RF input signal + and inverted RF signal − as the RF input signal, the operation of the frequency mixer of the fifth embodiment is similar to that of the first embodiment except for the operation of RF input signal + and inverted RF signal −. Furthermore, since amplitude-current conversion circuit 800 receiving differential RF input signals has a configuration similar to that of amplitude-current conversion circuit 700 of the fourth embodiment, amplitude-current conversion circuit 800 operates in a manner similar to that of amplitude-current conversion circuit 700.

Amplitude-current conversion circuit 800 functions to decrease monotonously output current If with respect to the amplitude of RF input signal + and inverted RF signal −. Specifically, amplitude-current conversion circuit 800 is adapted to decrease and increase output current If when the amplitude of the RF input signal + and inverted RF signal − is large and small, respectively.

According to the frequency mixer of the present embodiment, degradation in the linearity of local oscillator signal differential pair 100 can be prevented, as in the first embodiment, and the advantages achieved by the frequency mixer of Documents 1 and 2 can be maintained. In other words, a desired frequency conversion operation can be carried out, and the linearity of the local oscillator signal differential pair can be improved, even when a local oscillator signal of smaller amplitude is input.

Sixth Embodiment

The sixth embodiment relates to a frequency mixer including an amplitude-current conversion circuit 900, that is an exemplification of amplitude-current conversion circuit 400 of the first embodiment.

[Configuration]

Figure 11:
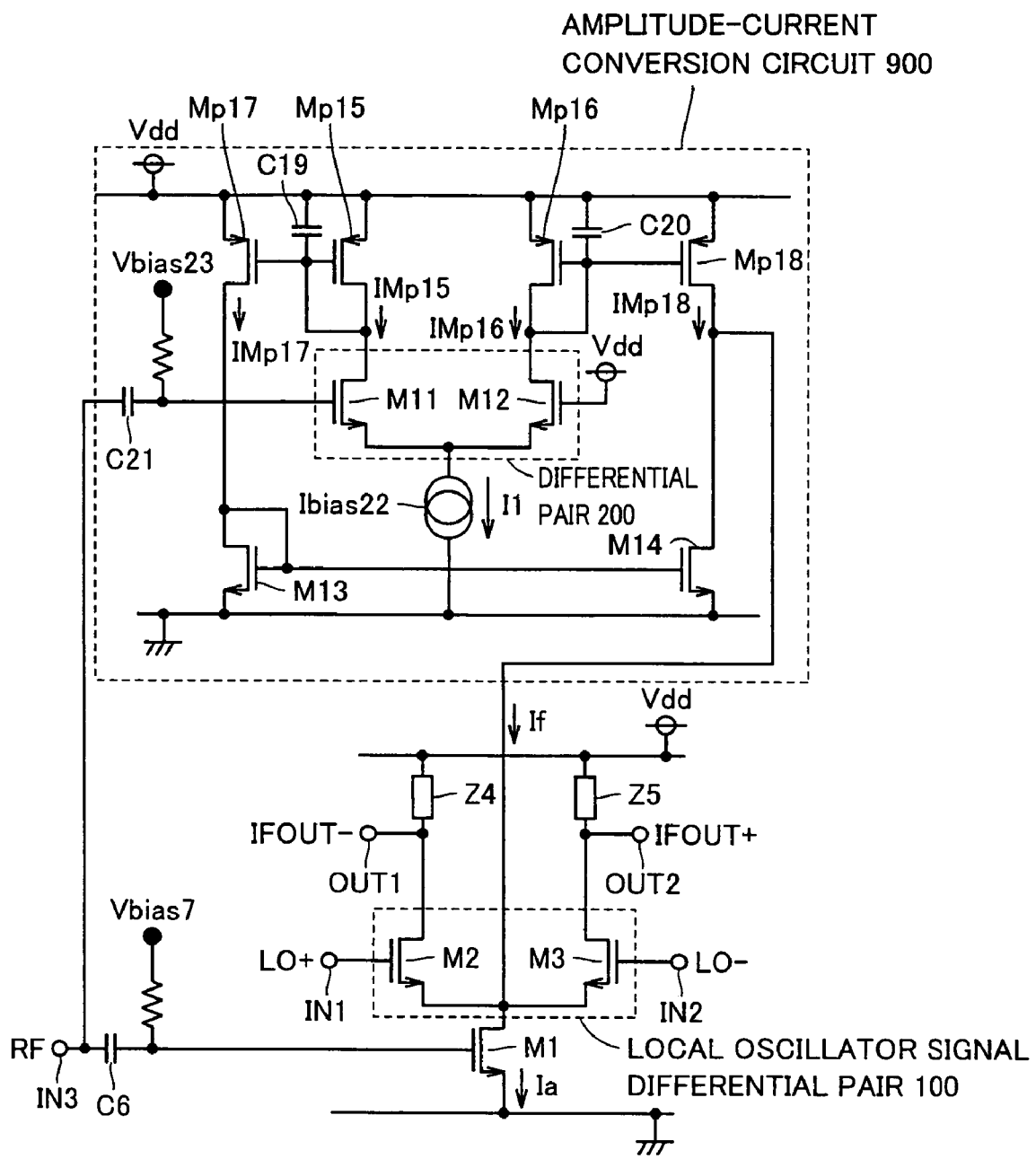

Referring to FIG. 11, the frequency mixer of the sixth embodiment has a configuration and connection similar to those of the first embodiment, with the exception of amplitude-current conversion circuit 900.

Amplitude-current conversion circuit 900 of the frequency mixer of the sixth embodiment includes an N channel MOS transistor M11 (eighth MOS transistor), an N channel MOS transistor M12 (ninth MOS transistor), an N channel MOS transistor M13 (tenth MOS transistor), an N channel MOS transistor M14 (eleventh MOS transistor), a P channel MOS transistor Mp15 (twelfth MOS transistor), a P channel MOS transistor Mp16 (thirteenth MOS transistor), a P channel MOS transistor Mp17 (fourteenth MOS transistor), a P channel MOS transistor Mp18 (fifteenth MOS transistor), a capacitor C19 (second capacitor), a capacitor C20 (third capacitor), a capacitor C21, a constant current source Ibias22 (third constant current source), and a voltage source Vbias 23. N channel MOS transistors M11 and M12 have substantially the same properties. N channel MOS transistors M13 and M14 have substantially the same properties. Furthermore, P channel MOS transistors Mp15, Mp16, Mp17, and Mp18 have substantially the same properties. N channel MOS transistors M13 and M14 constitute a current mirror circuit. P channel MOS transistors Mp15 and Mp17 constitute a current mirror circuit. P channel MOS transistors Mp16 and Mp18 constitute a current mirror circuit.

The drain current of P channel MOS transistor Mp15, Mp16, Mp17, and Mp18 is identified as IMp15, IMp16, IMp17, and IMp18, respectively. Constant current source Ibias22 outputs a constant current I1. Constant voltage source Vbias 23 outputs constant voltage Vbs23.

N channel MOS transistor M11 has its gate connected to constant voltage source Vbias23 and capacitor C21.

Capacitor C21 is connected to input terminal IN3.

N channel MOS transistor M12 has its gate connected to second fixed potential Vdd.

P channel MOS transistor Mp15 has its gate connected to the drain of P channel MOS transistor Mp15, and also to the gate of P channel MOS transistor Mp17. The connection node thereof is connected to capacitor C19 and the drain of N channel MOS transistor M11.

P channel MOS transistor Mp16 has its gate connected to the drain of P channel MOS transistor Mp16, and also to the gate of P channel MOS transistor Mp18. The connection node thereof is connected to capacitor C20 and the drain of N channel MOS transistor M12.

N channel MOS transistor M13 has its gate connected to the drain of N channel MOS transistor M13. The connection node thereof is connected to the drain of P channel MOS transistor Mp17 and the gate of N channel MOS transistor M14.

The source of N channel MOS transistor M11 is connected to the source of N channel MOS transistor M12. The connection node thereof is connected to constant current source Ibias22.

The drain of P channel MOS transistor Mp18 is connected to the drain of N channel MOS transistor M14, and also to the drain of N channel MOS transistor M1 as the output of amplitude-current conversion circuit 900.

The sources of P channel MOS transistor Mp15, Mp16, Mp17 and Mp18, as well as capacitors C19 and C20, are connected to second fixed potential Vdd.

The sources of N channel MOS transistors M13 and M14 and constant current source Ibias22 are connected to the first fixed potential (ground potential).

[Operation]

Since the frequency mixer of the sixth embodiment corresponds to a modification of the configuration of amplitude-current conversion circuit 500 of the second embodiment, the operation of the frequency mixer of the sixth embodiment is similar to that of the second embodiment, except for the internal operation of amplitude-current conversion circuit 900.

The operation of amplitude-current conversion circuit 900 of the frequency mixer of the sixth embodiment will be described hereinafter. It is assumed that all transistors operate in a saturation region.

FIGS. 12A-12C represent the relationship of gate-source voltage Vgs of N channel MOS transistor M11, threshold voltage Vth of N channel MOS transistor M11, constant voltage Vbs (output voltage Vbs23 of constant voltage source Vbias 23), drain current IMp15, drain current IMp16, drain current IMp17, drain current IMp18, and output current If.

Referring to FIGS. 12A-12C, N channel MOS transistor M11 is constantly OFF when the amplitude of the RF input signal is small and gate-source voltage Vgs of N channel MOS transistor M11 does not exceed threshold voltage Vth of N channel MOS transistor M11 (FIG. 12A). Since drain current IMp15 of P channel MOS transistor Mp15 flowing to the drain of N channel MOS transistor M11 is 0 here, drain current IMp17 of P channel MOS transistor Mp17 constituting a current mirror circuit with P channel MOS transistor Mp15 becomes 0. Since the current flowing to the drain of N channel MOS transistor M13 becomes 0, the drain current of N channel MOS transistor M14 constituting a current mirror circuit with N channel MOS transistor M13 also becomes 0.

Thus, N channel MOS transistor M11 is constantly OFF, and constant current source Ibias22 provides an output current of I1. Therefore, the drain current of N channel MOS transistor M12 attains the level of I1, whereby drain current IMp16 of P channel MOS transistor Mp16 flowing to the drain of N channel MOS transistor M12 becomes I1. At this stage, drain current IMp16 of P channel MOS transistor Mp16 includes only a direct current component.

Since P channel MOS transistor Mp16 and P channel MOS transistor Mp18 constituting a current mirror circuit have substantially the same properties, drain current IMp18 of P channel MOS transistor Mp18 attains the level of I1.

Furthermore, since the drain current of N channel MOS transistor M14 is 0, drain current IMp18 of P channel MOS transistor Mp18 flows, not to the drain of N channel MOS transistor M14, but entirely to the drain of N channel MOS transistor M1. In other words, output current If of amplitude-current conversion circuit 900 attains the level of I1.

When the amplitude of the RF input signal is increased to some level and gate-source voltage Vgs of N channel MOS transistor M11 exceeds threshold voltage Vth of N channel MOS transistor M11 (FIG. 12B), N channel MOS transistor M11 is turned ON periodically. The ON period thereof is shorter than half the period of the RF input signal.

Accordingly, the drain current of N channel MOS transistor M11 begins to flow periodically. Therefore, drain current IMp15 of P channel MOS transistor Mp15 flowing into the drain of N channel MOS transistor M11 includes a direct current component and an alternating current component.

Although the gate voltage of P channel MOS transistor Mp15 includes a direct current component and an alternating current component corresponding to drain current IMp15 at this stage, the alternating current component thereof is cut through the lowpass filter formed of the output resistance of P channel MOS transistor Mp15 (mutual conductance and drain-source resistance) and capacitor C19. Therefore, the gate-source voltage of P channel MOS transistor Mp17 includes only the direct current component of the gate-source voltage of P channel MOS transistor Mp15.

Since P channel MOS transistor Mp15 and P channel MOS transistor Mp17 constitute a current mirror circuit and have substantially the same properties, drain current IMp17 of P channel MOS transistor Mp17 is equal to the direct current component of drain current Imp15 of P channel MOS transistor Mp15.

Furthermore, since drain current IMp17 flows to the drain of N channel MOS transistor M13, and N channel MOS transistors M13 and M14 constituting a current mirror circuit have substantially the same properties, the drain current of N channel MOS transistor M14 becomes equal to drain current IMp17 of N channel MOS transistor Mp17.

When the drain current of N channel MOS transistor M11 begins to flow periodically, drain current IMp16 of P channel MOS transistor Mp16 flowing to the drain of N channel MOS transistor M12 decreases periodically from I1. Therefore, drain current IMp16 of P channel MOS transistor Mp16 includes a direct current component and an alternating current component.

Although the gate voltage of P channel MOS transistor Mp16 includes a direct current component and an alternating current component corresponding to drain current IMp16 at this stage, the alternating current component thereof is cut by the lowpass filter formed of the output resistance of P channel MOS transistor Mp16 (mutual conductance and drain-source resistance) and capacitor C20. Therefore, the gate-source voltage of P channel MOS transistor Mp18 includes only the direct current component of the gate-source voltage of P channel MOS transistor Mp16. Therefore, the drain current of P channel MOS transistor Mp18 decreases from I1, and includes only a direct current component.

Accordingly, from drain current IMp18 of P channel MOS transistor Mp18, a current corresponding to drain current IMp17 of P channel MOS transistor Mp17 flows to the drain of N channel MOS transistor M14, and the remaining current flows to the drain of N channel MOS transistor M1. In other words, output current If of amplitude-current conversion circuit 900 corresponds to IMp18-IMp17, and includes only a direct current component.

When the amplitude of the RF input signal is large enough (FIG. 12C) and gate-source voltage Vgs of N channel MOS transistor M11 sufficiently exceeds threshold voltage Vth of N channel MOS transistor M11 for substantially half the period of the RF input signal, the ON period of N channel MOS transistor M11 becomes longer. N channel MOS transistor M11 repeats an ON state and an OFF state for substantially every half period of the RF input signal. At this stage, the drain current of N channel MOS transistor M11 becomes 0, as set forth above, when N channel MOS transistor M11 is OFF.

When N channel MOS transistor M11 is ON, the drain current of N channel MOS transistor M11 and the drain current of N channel MOS transistor M12 become equally I1/2 since gate-source voltage Vgs of N channel MOS transistor M11 sufficiently exceeds threshold voltage Vth of N channel MOS transistor M11 and the output current of constant current source Ibias22 is I1. Therefore, the drain current of N channel MOS transistor M11 repeats I1/2 and 0 for substantially every half period of the RF input signal. Accordingly, drain current IMP15 of P channel MOS transistor Mp15 flowing to the drain of N channel MOS transistor M11 will not include a direct current component.

Although the gate voltage of P channel MOS transistor Mp15 includes only an alternating current component corresponding to drain current IMp15 at this stage, the alternating current component thereof is cut by the lowpass filter formed of the output resistance of P channel MOS transistor Mp15 (mutual conductance and drain-source resistance) and capacitor C19. Therefore, the gate-source voltage of P channel MOS transistor Mp17 becomes 0. Accordingly, drain current IMp17 of P channel MOS transistor Mp17 also becomes 0. Since the current flowing to the drain of N channel MOS transistor M13 becomes 0, the drain current of N channel MOS transistor M14 constituting a current mirror circuit with N channel MOS transistor M13 also becomes 0.

Drain current IMp16 of P channel MOS transistor Mp16 repeats I1 and I1/2 for substantially every half period of the RF input signal since the drain current of N channel MOS transistor M11 repeats I1/2 and 0 for substantially every half period of the RF input signal. At this stage, drain current IMp16 of P channel MOS transistor Mp16 includes a direct current component and an alternating current component.

Although the gate voltage of P channel MOS transistor Mp16 includes a direct current component and an alternating current component corresponding to drain current IMp16 of P channel MOS transistor Mp16, the gate-source voltage of P channel MOS transistor Mp18 includes only a direct current component since the output resistance of P channel MOS transistor Mp16 (mutual conductance and drain-source resistance) and capacitor C20 constitute a lowpass filter.

Since P channel MOS transistor Mp16 and P channel MOS transistor Mp18 constituting a current mirror circuit have substantially the same properties, the drain current of P channel MOS transistor Mp18 attains the level of I1/2.

Since the drain current of N channel MOS transistor M14 is 0 as described in the foregoing, drain current IMp18 of P channel MOS transistor Mp18 flows, not to the drain of N channel MOS transistor M14, but entirely to the drain of N channel MOS transistor M1. In other words, output current If of amplitude-current conversion circuit 900 attains the level of I1/2.

It is assumed that amplitude-current conversion circuit 900 operates under the condition set forth below.

Condition 1: Vbs23<Vdd

This is because, if the gate voltage of N channel MOS transistor M11 is too high, an OFF state thereof cannot be achieved. Amplitude-current conversion circuit 900 cannot operate as set forth above.

Condition 2: Capacitors C19 and C20 are sufficiently large. Specifically, the impedance is small enough at the frequency of the RF input signal.

This is to cut the alternating current component of the gate voltage of P channel MOS transistor Mp15 through the lowpass filter formed of the output resistance of P channel MOS transistor Mp15 (mutual conductance and drain-source resistance) and capacitor C19 in order to remove the alternating current component of the gate-source voltage of P channel MOS transistor Mp17.

Furthermore, this is to cut the alternating current component of the gate voltage of P channel MOS transistor Mp16 through the lowpass filter formed of the output resistance of P channel MOS transistor Mp16 (mutual conductance and drain-source resistance) and capacitor C20 in order to remove the alternating current component of the gate-source voltage of P channel MOS transistor Mp18.

Amplitude-current conversion circuit 900 of the sixth embodiment differs from amplitude-current conversion circuit 500 of the second embodiment in that output current If takes the range from I1/2 to 0 in amplitude-current conversion circuit 500 whereas output current If takes the range from I1 to I1/2 in amplitude-current conversion circuit 900.

However, likewise amplitude-current conversion circuit 500 of the second embodiment, amplitude-current conversion circuit 900 of the present embodiment achieves the characteristic of output current If of amplitude-current conversion circuit 900 decreasing monotonously with respect to the amplitude of RF input signal, as shown in FIG. 7.

Thus, amplitude-current conversion circuit 900 of the sixth embodiment functions to decrease monotonously output current If with respect to the amplitude of the RF input signal. Specifically, amplitude-current conversion circuit 900 is adapted to decrease and increase output current If when the amplitude of the RF input signal is large and small, respectively.

In accordance with the frequency mixer of the present embodiment, degradation of the linearity of local oscillator signal differential pair 100 can be prevented, as in the second embodiment, and the advantage achieved by the frequency mixer of Documents 1 and 2 can be maintained. In other words, a desired frequency conversion operation can be carried out, and the linearity of the local oscillator signal differential pair can be improved, even when a local oscillator signal of smaller amplitude is input.

[Modification]

The present invention is not limited to the embodiments described in the foregoing, and may include modifications set forth below.

Although the embodiment has been described in which the first fixed potential is a ground potential and the second fixed potential is Vdd, it will be understood that such description is merely exemplary, and the first fixed potential may be Vdd and the second fixed potential may be the ground potential.

The embodiments of the present invention were described with the P channel MOS transistors and N channel MOS transistors specified. It will be understood that such description is merely exemplary, and a P channel MOS transistor may be altered to an N channel MOS transistor, and an N channel MOS transistor may be altered to a P channel MOS transistor.

The second embodiment was described in which output current I2 of constant current source Ibias18 is I1/2. It will be understood that such description is merely exemplary. When output current I2 of constant current source Ibias18 is smaller than I1, output current If of amplitude-current conversion circuit 500 can be decreased monotonously with respect to the RF input signal, in which case the object of the present invention can be achieved.

The second embodiment was described in which P channel MOS transistor Mp13 and P channel MOS transistor Mp14 have substantially the same properties. It will be understood that such description is merely exemplary, and P channel MOS transistor Mp13 may have properties differing from those of P channel MOS transistor Mp14. Inclination of the monotonous decrease property of output current If of amplitude-current conversion circuit 500 with respect to the amplitude of the RF input signal can be modified.

The sixth embodiment was described in which N channel MOS transistors M13 and M14, P channel MOS transistors Mp15 and Mp17, and P channel MOS transistors Mp16 and Mp18 have substantially the same properties. It will be understood that such description is merely exemplary, and the minimum value of the range of output current If of amplitude-current conversion circuit 900 can be reduced from I1/2 by altering the values of these MOS transistors and respective elements.

For example, by setting different properties for N channel MOS transistors M13 and M14, for P channel MOS transistors Mp15 and Mp17, and for P channel MOS transistors Mp16 and Mp18, constituting respective current mirror circuits, the current mirror ratio through the current mirror circuit formed of P channel MOS transistors Mp15 and Mp17, and the current mirror circuit formed of N channel MOS transistors M13 and M14 can be increased.

In other words, by increasing the ratio of the drain current of N channel MOS transistor M14 to drain current IMp15 of P channel MOS transistor Mp15, the drain current of N channel MOS transistor M14 can be set larger to reduce output current If.

The sixth embodiment was described in which the drain current of N channel MOS transistor M11 and the drain current of N channel MOS transistor M12 equally become I1/2 when the amplitude of the RF input signal is sufficiently large. However, when the amplitude of the RF input signal can exceed second fixed potential Vdd, gate-source voltage Vgs of N channel MOS transistor M11 will exceed second fixed potential Vdd, so that the drain current of N channel MOS transistor M11, when in an ON state, exceeds the drain current of N channel MOS transistor M12. Therefore, the direct current component of the drain current of N channel MOS transistor M12, i.e. drain current IMp18 of P channel MOS transistor Mp18, becomes lower than I1/2 whereby output current If can be set smaller than I1/2.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A frequency mixer comprising:
a first MOS transistor,
a local oscillator signal differential pair including a second MOS transistor and a third MOS transistor having substantially identical properties,
a first load,
a second load, and
a control circuit,
wherein said first MOS transistor receives an RE signal at a gate,
said second MOS transistor has a source connected to a source of said third MOS transistor, and a connection node thereof is connected to a drain of said first MOS transistor,
said second MOS transistor receives a local oscillator signal at a gate, and has a drain connected to said first load,
said third MOS transistor receives an inverted local oscillator signal at a gate, and has a drain connected to said second load,
said second MOS transistor outputs an IF signal from a drain,
said third MOS transistor outputs an inverted IF signal from a drain,
said first load and said second load are connected to a fixed potential, and
said control circuit receives said RF signal and outputs a current to the drain of said first MOS transistor to decrease monotonously said current with respect to an amplitude of said RF signal,
said control circuit comprises a fourth MOS transistor and a fifth MOS transistor having substantially identical properties, a sixth MOS transistor, a seventh MOS transistor, a first constant current source, a second constant current source, and a first capacitor,
said fourth MOS transistor receives said RF input signal at a gate, and has a drain connected to the fixed potential,
said fifth MOS transistor has a gate connected to the fixed potential, and a drain connected to said second constant current source, a drain and gate of said sixth MOS transistor, said first capacitor, a gate of said seventh MOS transistor, and said first capacitor,
said fourth MOS transistor has a source connected to a source of said fifth MOS transistor, and a connection node thereof is connected to said first constant current source,
said second constant current source, a source of said sixth MOS transistor, said first capacitor, and a source of said seventh MOS transistor are connected to the fixed potential,
said seventh MOS transistor has a drain connected to the drain of said first MOS transistor,
said second constant current source outputs a current lower than said first constant current source, and
a drain current of said seventh MOS transistor is decreased monotonously with respect to the amplitude of said RF signal.

2. A frequency mixer comprising
a first MOS transistor,
a local oscillator signal differential pair including a second MOS transistor and a third MOS transistor having substantially identical properties,
a first load,
a second load, and
a control circuit,
wherein said first MOS transistor receives an RF signal at a gate,
said second MOS transistor has a source connected to a source of said third MOS transistor, and a connection node thereof is connected to a drain of said first MOS transistor,
said second MOS transistor receives a local oscillator signal at a gate, and has a drain connected to said first load,
said third MOS transistor receives an inverted local oscillator signal at a gate, and has a drain connected to said second load,
said second MOS transistor outputs an IF signal from a drain,
said third MOS transistor outputs an inverted IF signal from a drain,
said first load and said second load are connected to a fixed potential,
said control circuit receives said RF signal and outputs a current to the drain of said first MOS transistor to decrease monotonously said current with respect to an amplitude of said RF signal,
said control circuit comprises an eighth MOS transistor and a ninth MOS transistor having substantially identical properties, a tenth MOS transistor, an eleventh MOS transistor, a twelfth MOS transistor, a thirteenth MOS transistor, a fourteenth MOS transistor, a fifteenth MOS transistor, a third constant current source, a second capacitor, and a third capacitor,
said eighth MOS transistor receives the RF signal at a gate, and has a drain connected to a drain and gate of said twelfth MOS transistor, a gate of said fourteenth MOS transistor, and said second capacitor,
said ninth MOS transistor has a gate connected to the fixed potential, and a drain connected to a drain and gate of said thirteenth MOS transistor, the third capacitor, and a gate of said fifteenth MOS transistor,
said eighth MOS transistor has a source connected to a source of said ninth MOS transistor, and a connection node thereof is connected to said third constant current source,
a source of said twelfth MOS transistor, a source of said thirteenth MOS transistor, a source of said fourteenth MOS transistor, a source of said fifteenth MOS transistor, said second capacitor, and said third capacitor are connected to the fixed potential,
said fourteenth MOS transistor has a drain connected to the drain and gate of said tenth MOS transistor,
said eleventh MOS transistor has a gate connected to the drain and gate of said tenth MOS transistor,
said fifteenth MOS transistor has a drain connected to the drain of said eleventh MOS transistor and the drain of said first MOS transistor, and
a current flowing from the drain of said fifteenth MOS transistor to the drain of said first MOS transistor is decreased monotonously with respect to the amplitude of said RF signal.

3. A frequency mixer comprising:
a first MOS transistor,
a local oscillator signal differential pair including a second MOS transistor and a third MOS transistor having substantially identical properties,
a first load,
a second load, and
a control circuit,
wherein said first MOS transistor receives an RF signal at a gate, said second MOS transistor has a source connected to a source of said third MOS transistor, and a connection node thereof is connected to a drain of said first MOS transistor, said second MOS transistor receives a local oscillator signal at a gate, and has a drain connected to said first load, said third MOS transistor receives an inverted local oscillator signal at a gate, and has a drain connected to said second load, said second MOS transistor outputs an IF signal from a drain, said third MOS transistor outputs an inverted IF signal from a drain, said first load and said second load are connected to a fixed potential, said control circuit receives said RF signal and an inverted RF signal, and outputs a current to the drain of said first MOS transistor to decrease monotonously said current with respect to the amplitude of said RE signal and said inverted RF signal, said control circuit comprises a fourth MOS transistor and a fifth MOS transistor having substantially identical properties, a sixth MOS transistor, a seventh MOS transistor, an eighth MOS transistor and a ninth MOS transistor having substantially identical properties, a first constant current source, a second constant current source, a third constant current source, a first capacitor, and a third load, said fourth MOS transistor has a gate connected to a drain of said ninth MOS transistor and said third load, and has a drain connected to the fixed potential, said fifth MOS transistor has a gate connected to the fixed potential, and a drain connected to said second constant current source, a drain and gate of said sixth MOS transistor, said first capacitor, and a gate of said seventh MOS transistor, said fourth MOS transistor has a source connected to a source of said fifth MOS transistor, and a connection node thereof is connected to said first constant current source, said second constant current source, a source of said sixth MOS transistor, said first capacitor, and a source of said seventh MOS transistor are connected to the fixed potential, said seventh MOS transistor has a drain connected to a drain of said first MOS transistor, said eighth MOS transistor receives said RF signal at a gate, and said ninth MOS transistor receives said inverted RF signal at a gate, said eighth MOS transistor has a source connected to a source of said ninth MOS transistor, and a connection node thereof is connected to said third constant current source, a drain of said eighth MOS transistor and said first load are connected to the fixed potential, said second constant current source outputs a current smaller than said first constant current source, and a drain current of said seventh MOS transistor is decreased monotonously with respect to the amplitude of said RF signal.

4. A frequency mixer comprising:

a first MOS transistor, a local oscillator signal differential pair including a second MOS transistor and a third MOS transistor having substantially identical properties, a first load, a second load, and a control circuit, wherein said first MOS transistor receives an RF signal at a gate, said second MOS transistor has a source connected to a source of said third MOS transistor, and a connection node thereof is connected to a drain of said first MOS transistor, said second MOS transistor receives a local oscillator signal at a gate, and has a drain connected to said first load, said third MOS transistor receives an inverted local oscillator signal at a gate, and has a drain connected to said second load, said second MOS transistor outputs an IF signal from a drain, said third MOS transistor outputs an inverted IF signal from a drain, said first load and said second load are connected to a fixed potential, and said control circuit receives said IF signal and said inverted IF signal, and outputs a current to the drain of said first MOS transistor to decrease monotonously said current with respect to the amplitude of said IF signal and said inverted IF signal.

5. The frequency mixer according to claim 4, wherein said control circuit comprises a fourth MOS transistor and a fifth MOS transistor having substantially identical properties, a sixth MOS transistor, a seventh MOS transistor, an eighth MOS transistor and a ninth MOS transistor having substantially identical properties, a first constant current source, a second constant current source, a third constant current source, a first capacitor, and a third load, said fourth MOS transistor has a gate connected to a drain of said ninth MOS transistor and said third load, and has a drain connected to the fixed potential, said fifth MOS transistor has a gate connected to the fixed potential, and a drain connected to said second constant current source, a drain and gate of said sixth MOS transistor, said first capacitor, a gate of said seventh MOS transistor, and said first capacitor, said fourth MOS transistor has a source connected to a source of said fifth MOS transistor, and a connection node thereof is connected to said first constant current source, said second constant current source, a source of said sixth MOS transistor, said first capacitor, and a source of said seventh MOS transistor are connected to the fixed potential, said seventh MOS transistor has a drain connected to a drain of said first MOS transistor, said eighth MOS transistor receives said IF signal at a gate, and said ninth MOS transistor receives said inverted IF signal at a gate, said eighth MOS transistor has a source connected to a source of said ninth MOS transistor, and a connection node thereof is connected to said third constant current source, a drain of said eighth MOS transistor and said first load are connected to the fixed potential, said second constant current source outputs a current smaller than said first constant current source, and a drain current of said seventh MOS transistor is decreased monotonously with respect to the amplitude of said IF signal and said inverted IF signal.

* * * * *